United States Patent [19]
Strodtbeck et al.

[11] Patent Number: 5,885,353
[45] Date of Patent: Mar. 23, 1999

[54] THERMAL CONDITIONING APPARATUS

[75] Inventors: Timothy A. Strodtbeck, Boise; John S. Molebash, Meridian; Bruce L. Hayes; Rex A. Smith, both of Boise; Shawn D. Davis, Meridian, all of Id.

[73] Assignee: Micron Technology, Inc., Boise, Id.

[21] Appl. No.: 667,704

[22] Filed: Jun. 21, 1996

[51] Int. Cl.⁶ .................................................. B05C 11/00
[52] U.S. Cl. .............................. 118/712; 118/52; 118/56; 118/319; 118/320; 118/500; 118/666; 118/667; 118/668; 118/728; 156/345; 269/21; 269/289 R; 269/292; 269/293; 269/294; 269/296; 269/903
[58] Field of Search ............................... 118/52, 56, 319, 118/220, 500, 666, 667, 668, 712, 728; 156/345; 269/289 R, 292, 293, 294, 903, 21, 296

[56] References Cited

U.S. PATENT DOCUMENTS

| | | | |
|---|---|---|---|
| 4,640,501 | 2/1987 | Poland | 269/21 |
| 4,671,250 | 6/1987 | Hurley et al. | 126/21 |
| 4,684,113 | 8/1987 | Douglas et al. | 269/21 |
| 4,693,211 | 9/1987 | Ogami et al. | |
| 4,870,923 | 10/1989 | Sugimoto | |
| 4,955,590 | 9/1990 | Narushima et al. | |
| 5,382,311 | 1/1995 | Ishikawa et al. | 118/728 |
| 5,462,603 | 10/1995 | Murakami | 118/728 |
| 5,516,367 | 5/1996 | Lei et al. | 118/728 |
| 5,564,682 | 10/1996 | Tsuji | 269/21 |
| 5,569,350 | 10/1996 | Osada et al. | 118/728 |
| 5,660,673 | 8/1997 | Miyoshi | 156/345 |
| 5,665,166 | 9/1997 | Deguchi et al. | 118/728 |
| 5,665,167 | 9/1997 | Deguchi et al. | 118/728 |
| 5,669,977 | 9/1997 | Shufflebotham et al. | 118/728 |
| 5,695,568 | 12/1997 | Sinha et al. | 118/500 |
| 5,700,725 | 12/1997 | Hower et al. | 118/500 |
| 5,707,051 | 1/1998 | Tsuji | 269/21 |

FOREIGN PATENT DOCUMENTS

| | | | |
|---|---|---|---|
| 63-131535 | 6/1988 | Japan | 269/21 |
| 63-229732 | 9/1988 | Japan | 269/21 |
| 3-12948 | 1/1991 | Japan | 269/21 |
| 4-64216 | 2/1992 | Japan | 269/21 |

*Primary Examiner*—Peter Chin
*Assistant Examiner*—Michael P. Colaianni
*Attorney, Agent, or Firm*—Kirkpatrick & Lockhart LLP

[57] ABSTRACT

Apparatuses are provided for thermally conditioning material. The apparatus includes a plate having a top surface for receiving material, a temperature controller connected to control the temperature of the top surface of the plate and the temperature controller is controlled by a computer controller. In a preferred embodiment, three tubular shaped ceramic support members, each containing a bore, are provided to support the material and a negative pressure source is provided in fluid communication with the bores. In addition, three lift elements having contacting ends are slidably disposed through receiving holes in the thermal conditioning plate and aligned to support the material on the contacting ends. Preferably, at least one of the lift pins contains a bore with a sensor positioned to detect the presence of material on the contacting end of the lift pin and provide a signal to the computer controller that can be used to control the negative pressure source and the relative movement of the plate and lift pins. Also, in a preferred embodiment, the apparatus includes an exhausted cover providing for a stagnation region adjacent to the material during operation, thereby providing for more uniform heat transfer to the material.

38 Claims, 7 Drawing Sheets

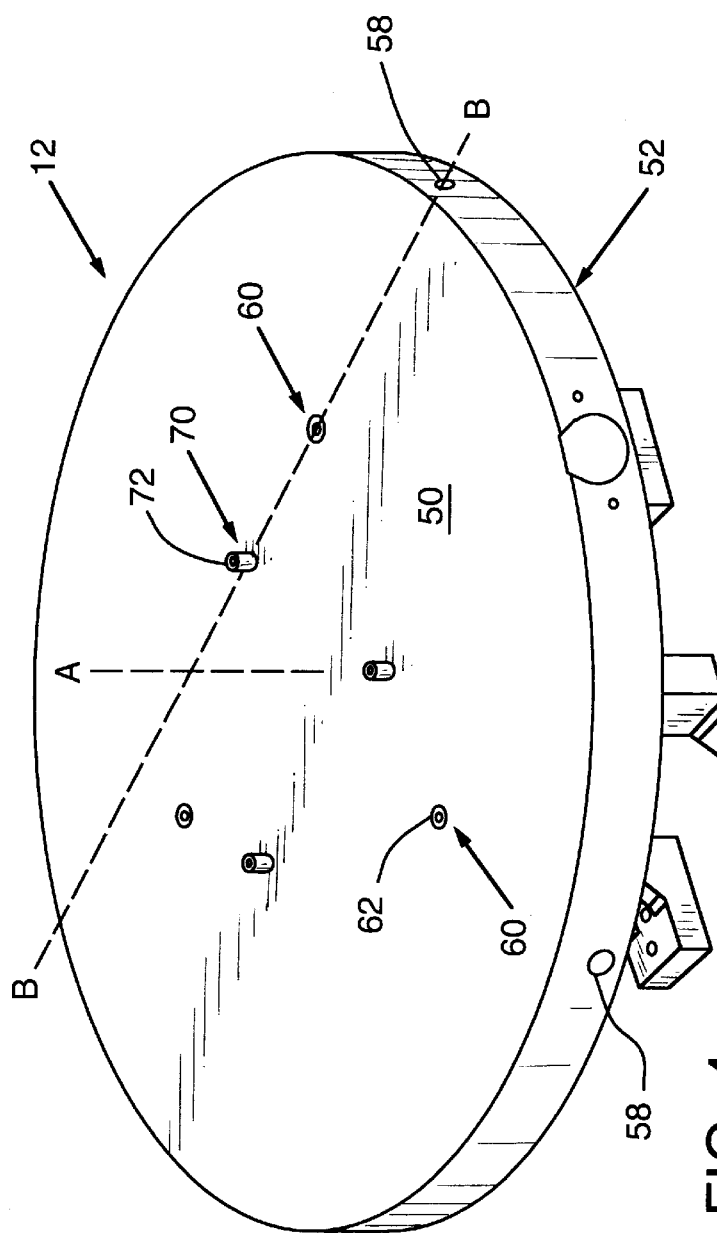
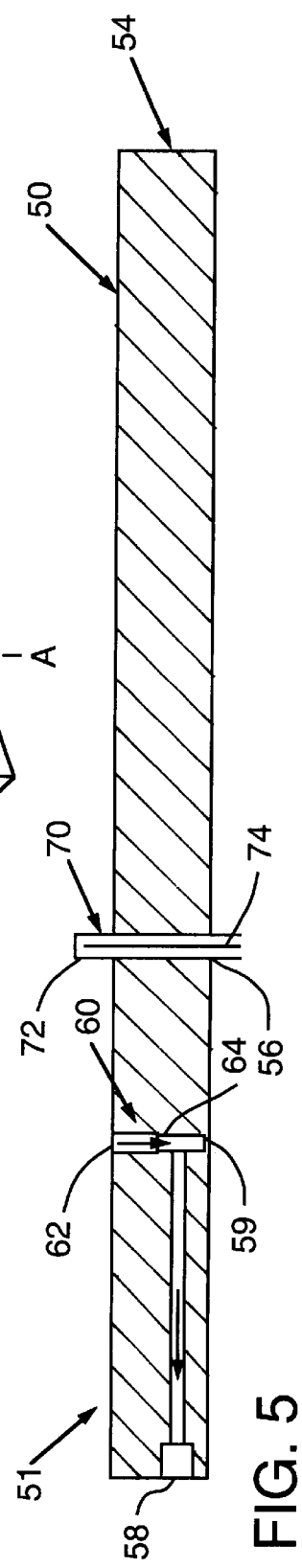
FIG. 4
FIG. 5

THERMAL CONDITIONING APPARATUS

BACKGROUND OF THE INVENTION

1. Field of the Invention

The present invention relates to an improved thermal conditioning apparatus and methods of using the same. More particularly, the present invention relates to improved thermal conditioning plate and method for use in controlling the temperature in the placement and curing of photoresist on a semiconductor substrate wafer.

2. Description of the Invention Background

Integrated circuits are typically constructed by depositing a series of individual layers of predetermined materials on a wafer shaped semiconductor substrate, or "wafer". The individual layers of the integrated circuit are, in turn, produced by a series of manufacturing steps. For example, in forming an individual circuit layer on a wafer containing a previously formed circuit layer, an oxide, such as silicon dioxide, is deposited over the previously formed circuit layer to provide an insulating layer for the circuit. A pattern for the next circuit layer is then formed on the wafer using a radiation alterable material, known as photoresist. Photoresist materials are generally composed of a mixture of organic resins, sensitizers and solvents. Sensitizers are compounds, such as diazonaphtaquinones, that undergo a chemical change upon exposure to radiant energy, such as visible and ultraviolet light, resulting in an irradiated material having differing solvation characteristics with respect to various solvents than the nonirradiated material. Resins are used to provide mechanical strength to the photoresist and the solvents serve to lower the viscosity of the photoresist so that it can be uniformly applied to the surface of the wafers. After a photoresist layer is applied to the wafer surface, the solvents are evaporated and the photoresist layer is hardened, usually by heat treating the wafer. The photoresist layer is then selectively irradiated by placing a radiation opaque mask containing a transparent portion defining the pattern for the next circuit layer over the photoresist layer and then exposing the photoresist layer to radiation. The photoresist layer is then exposed to a chemical, known as developer, in which either the irradiated or the nonirradiated photoresist is soluble and the photoresist is removed in the pattern defined by the mask, selectively exposing portions of the underlying insulating layer. The exposed portions of the insulating layer are then selectively removed using an etchant to expose corresponding sections of the underlying circuit layer. The photoresist must be resistant to the etchant, so as to limit the attack of the etchant to only the exposed portions of the insulating layer. Alternatively, the exposed underlying layer(s) may be implanted with ions which do not penetrate the photoresist layer thereby selectively penetrating only those portions of the underlying layer not covered by the photoresist. The remaining photoresist is then stripped using either a solvent, or a strong oxidizer in the form of a liquid or a gas in the plasma state. The next layer is then deposited and the process is repeated until fabrication of the semiconductor device is complete.

Photoresist and developer materials are typically applied to the wafer using a spin coating technique in which the photoresist is sprayed on the surface of the wafer as the wafer is spun on a rotating chuck. The spinning of the wafer distributes the photoresist over the surface of the material and exerts a shearing force that separates the excess photoresist from the wafer thereby providing for a thin layer of photoresist on the surface of the wafer. Following the spin coating of the wafer, the coating is heated, or soft baked, to remove the volatile solvent components, thereby hardening the photoresist.

The properties of the photoresist, and, therefore, the suitability of the photoresist for use in the subsequent processing steps, are largely dependent upon the ability to uniformly harden the photoresist. The heating of the photoresist can be performed either by convection, infrared heating or through the use of a hot plate. While convection and infrared heating can be performed in bulk, the use of a hot plate to individually bake the wafer on a heating surface has become the preferred method. This is because the hot plate method provides for rapid heating of the wafer and the heating occurs from the wafer-photoresist interface toward the surface of the photoresist, which tends to drive off gas pockets present in the photoresist and also prevents the formation of a surface crust on the photoresist. In order for the hot plate soft baking technique to be cost effective in comparison with the batch techniques, an automated wafer handling system must be used to maximize the throughput of the wafers. In addition, cooling assemblies are often employed to reduce the cooling time for the wafer so as to enhance the overall throughput of the system. As such, the heating and cooling system are directly tied into the automated wafer handling system.

A problem that arises with the prior art integrated spin coating systems is that when the heating or cooling assemblies must be repaired or replaced, extensive and costly amounts of downtime occur because of the integration of the system. The costs are especially significant in a clean room environment in which all operations in the clean room have to be shut down until cleanliness can again be achieved at a cost of thousands of dollars an hour. For instance, if the heating element must be replaced in the hot plate, not only must the system be shutdown for the replacement, but following the replacement of the heating element the system will have to be recalibrated prior to restarting the system and the cleanliness procedure followed to reestablish cleanliness in the clean room.

In the operation of the heating or cooling assemblies, the wafers are placed either directly upon the heating/cooling surface of the plate, or, alternatively, upon a plurality of receiving pins, from which the wafers are placed on the surface using an assembly such as that described in U.S. Pat. No. 4,955,590 issued to Narushima et al. The use of receiving pins and/or a table that reciprocates is a preferred method of loading in the industry because it provides access to the exposed uncoated surface for the loading and unloading of the wafers with automated handling equipment when the wafer is seated upon the receiving pins. One problem with this method as discussed in the Narushima patent (col. 1, lines 38–41) is that, if the receiving pins are lowered, the air resistance causes the wafer to float, which can result in misalignment of the wafer on the pins. The Narushima patent (col. 4, lines 37–44) indicates that by moving the table and not the pins this problem is eliminated, because the wafer is not moved; however, the raising of the table will exert a force on the bottom of the wafer that is analogous to the force exerted when the wafer is lowered, thus floating of the wafer will occur even when the table is raised and the pins are stationery. A possible solution to this problem suggested in the Narushima patent (col. 5, lines 3–6) is to draw a vacuum through the distal end of the receiving pins to chuck the wafer against the distal end of the pins to prevent movement. While this solution appears to provide a more plausible method of preventing the wafer from floating, the method greatly complicates the overall design of the system. This is because the wafer must be removed from the receiving pins requiring that the vacuum be released when the wafer reaches the table either through the use of a sensing system or by moving the table at a speed so as to dislodge the wafer from the receiving pins; however, this type of mechanical release would most likely result in misalignment problems and could also potentially damage the wafer. As such, there is need for an improved apparatus and method for receiving wafers, and plate-like material in general, in a plate-like material treating apparatus.

A number of methods exist in the prior art to hold the wafer in position on the surface of the plate following the transfer of the wafer from the receiving pins to the plate. One method is to directly place the wafer on the plate surface and to apply a vacuum through a hole in the surface adjacent to the wafer to hold the wafer in place, as discussed in the Narushima patent (col. 2, lines 50–55). A problem with this method is that uneven heating or cooling of the wafer occurs especially in the vicinity of the holes provided for the receiving pins and for the applying the vacuum and due to thermal maldistributions in the remainder of the plate. An alternative to directly placing the wafer on the surface has been to use ball shaped supports that are press fit into the top surface of the plate thereby creating an air layer between the wafer and the surface that would tend to more uniformly distribute the transfer of energy. However, the use of ball shaped supports reintroduces the problem of securing the wafer on the surface. In addition, the air layer between the wafer and surface must be very small (~0.1 mm) in order to maintain the desirable heat transfer characteristics associated with the plate heating/cooling technique, thus requiring that very small ball shaped supports be machined and precisely attached the heat transfer surface of the plate. Accordingly, a need exists for an improved apparatus and method for supporting of plate-like material during thermal treating operations.

During the heating of the wafer on the plate, the volatile solvents in the photoresist are evaporated and must be exhausted to prevent condensation in the system and to provide environmental control of the vapors. In the prior art, as shown in FIGS. 1 and 2, as a wafer is heated on a hot plate 3, either by drawing air over the wafer 2 from the annular region 4 and exhausting the vapor through a perforated plate 5 and exhaust port 6 from above the wafer 2 or drawing air through the perforated plate 5 over the wafer from above the wafer and exhausting the vapors from the annular region 4 surrounding the wafer 2. The exhausting of the solvent vapors requires a large throughput of air that must be drawn from outside of the heating assembly resulting in cool air being drawn over the surface of the wafer. The direct contact of the cool air with the surface can produce uneven cooling of the surface resulting in nonuniformities in the photoresist coating. Also, the outside air can introduce contamination directly onto the surface of the photoresist further degrading the coating. In view of the aforementioned, there is a need for an improved exhaust system and more generally a need for an improved thermal conditioning apparatus and method.

The present invention is directed to a self-contained thermal conditioning apparatus and methods of using the same which overcomes, among others, the above-discussed problems so as to provide a more easily controlled and more uniform photoresist coatings for use in semiconductor production.

SUMMARY OF THE INVENTION

The above objects and others are accomplished by a apparatus and method in accordance with the present invention. The apparatus includes a thermal conditioning plate having a top surface being positioned on a base to receive plate-like material on the top surface, a temperature controller positioned on the base to control the temperature of the top surface of the plate and the temperature controller is controlled by a computer controller. In a preferred embodiment, three tubular shaped ceramic support pins or members containing a bore are mounted in the top surface of the plate so that a proximal end of the support pin is used to support the plate-like material and a vacuum source is attached to a distal end of the bores. Three lift pins or elements having contacting ends are slidably disposed through receiving holes in the thermal conditioning plate and the lift pins are aligned to support the plate-like material on the contacting ends and one of the lift pins contains a longitudinal bore with a sensor positioned therein to detect the presence of plate-like material on the contacting end of the lift pin.

Also in a preferred embodiment, the apparatus includes a cover having an exhaust port, an endless rim having a first edge attached to the cover defining an interior and an exterior region, a second edge, a plurality of flow holes from said interior to said exterior regions proximate to said cover and a perforated plate attached between the flow holes and the second edge. The exhaust port is in fluid communication with the interior region and the perforated plate and the top surface of the plate define a stagnant region when the second edge is seated on the top surface of the plate, thereby enclosing the plate-like material. Preferably, the plate is movable between a first position in which the second edge of the rim is in contact with the top surface and the plate-like material is supported by the plate and a second position in which the lift pins extend through the top surface and support the plate-like material using a computer controlled motor driven cam arrangement which is connected to the computer controller.

Accordingly, the present invention provides an effective solution to problems associated with thermally conditioning plate-like material by providing for more uniform heating and cooling of the material and improved alignment and process control. These advantages and others will become apparent from the following detailed description of the present invention.

BRIEF DESCRIPTION OF THE DRAWINGS

The preferred embodiment of the present invention will be described in greater detail with reference to the accompanying drawings, wherein like members bear like reference numerals and wherein:

FIG. 4 is a perspective view of the thermal conditioning plate of the present invention;

FIG. 5 is a cross sectional view of the thermal conditioning plate of the present invention along line B—B of FIG. 4;

DETAILED DESCRIPTION OF THE PREFERRED EMBODIMENTS

Figure 1:
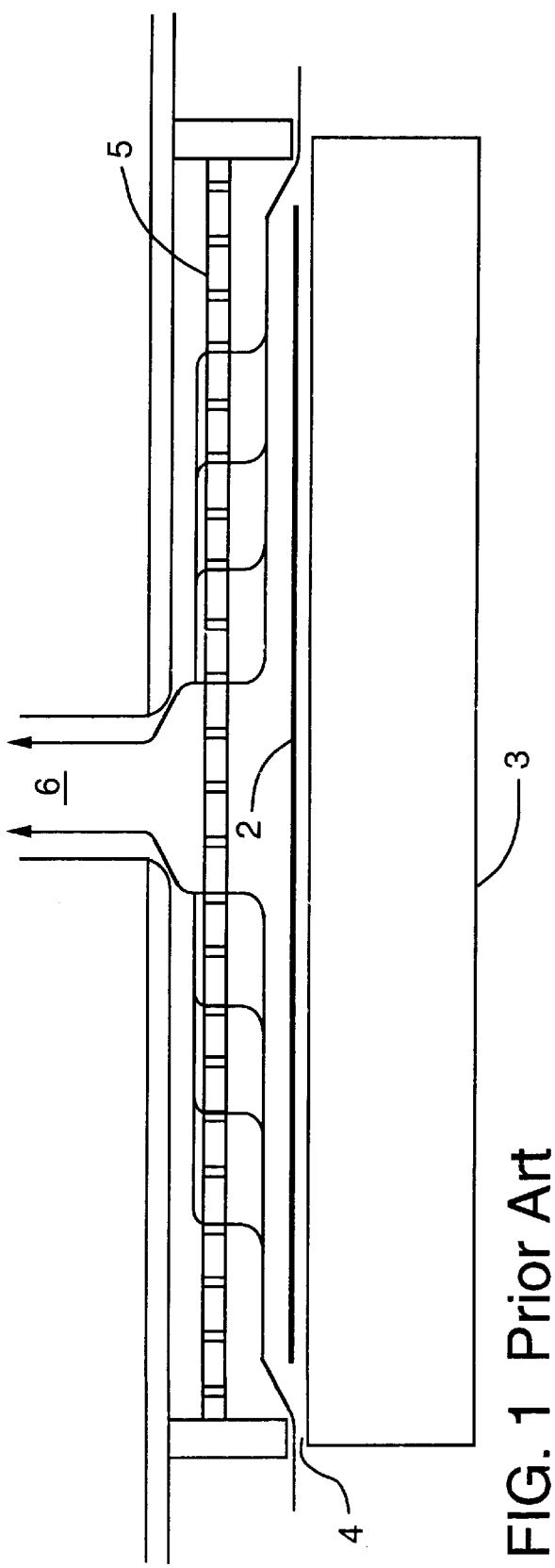
FIG. 1 is a side view of a prior art exhaust system.
Figure 2:
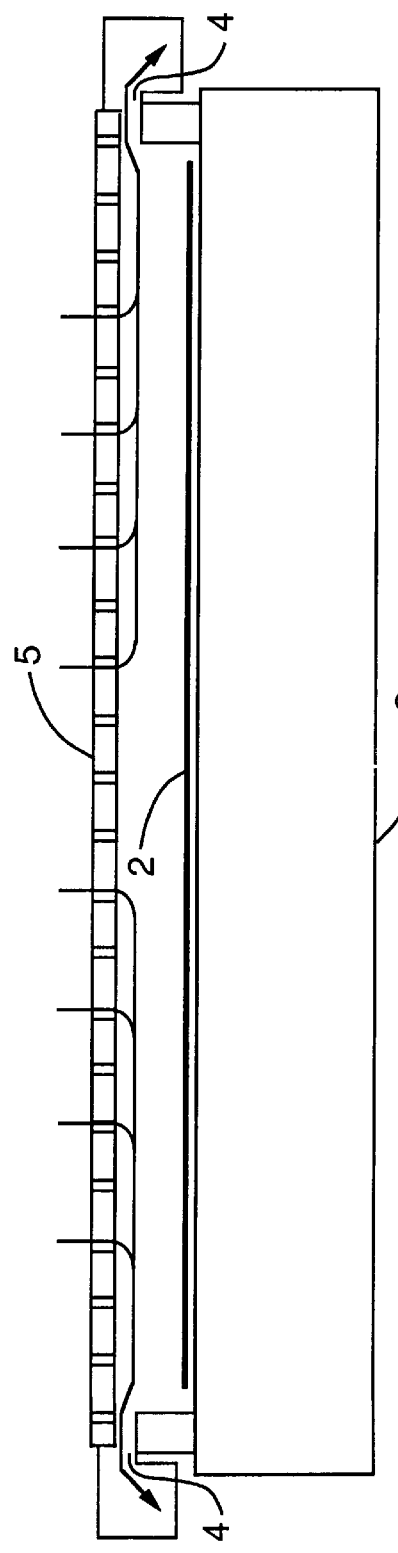
FIG. 2 is a side view of a prior art exhaust system.
Figure 3:
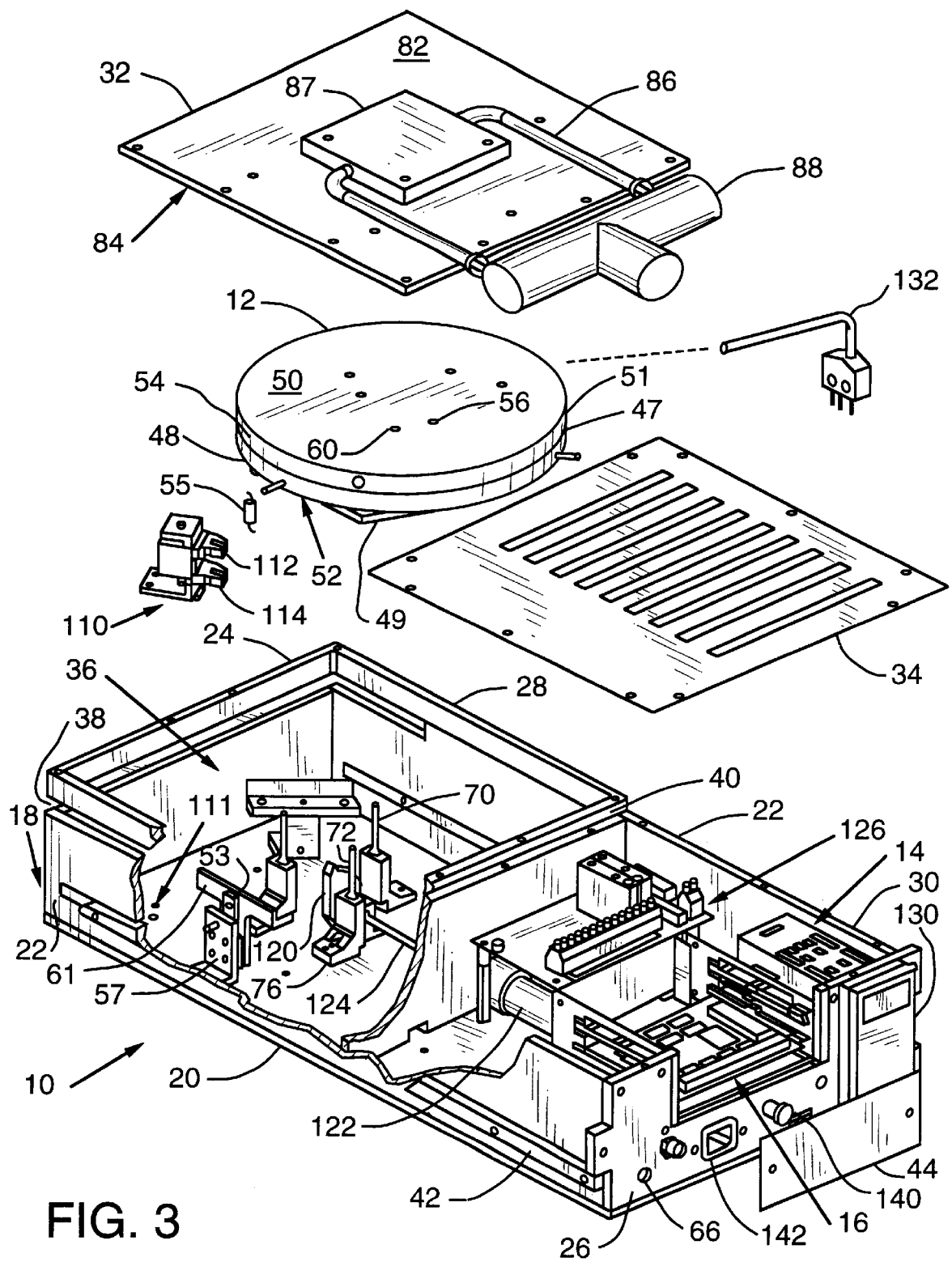
FIG. 3 is a perspective partially exploded cutaway view of the apparatus of the present invention.

The operation of the thermal conditioning apparatus 10 will be described generally with reference to the drawings for the purpose of illustrating present preferred embodiments of the invention only and not for purposes of limiting the same. The thermal conditioning apparatus 10 of the present invention includes a thermal conditioning plate 12 coupled to a temperature controller 14 and a computer controller 16 in a housing 18 to provide a self-contained thermal conditioning apparatus 10. While the preferred embodiments will be described for convenience generally with respect to use of the apparatus 10 to heat, or soft bake, a plate-like material or wafer 19, persons skilled in the art will appreciate that the present invention is equally well suited for use in cooling, preheating and chilling apparatuses and the like.

In a preferred embodiment, the substantially rectangular housing 18 includes a base 20, two elongated sides 22, a front 24, a back 26 and first and second sections, 28 and 30, respectively, with corresponding first and second top covers, 32 and 34, respectively, defining an interior 36. The front 24 contains an opening 38 parallel to the base 20 to provide access to the interior of the housing 18. The first and second sections 28 and 30, respectively, are divided by separated by a dividing wall 40 that is preferably insulated. In addition, alignment rails 42 are provided in the sides 22 and the back 26 includes a removable access plate 44.

Figure 9:
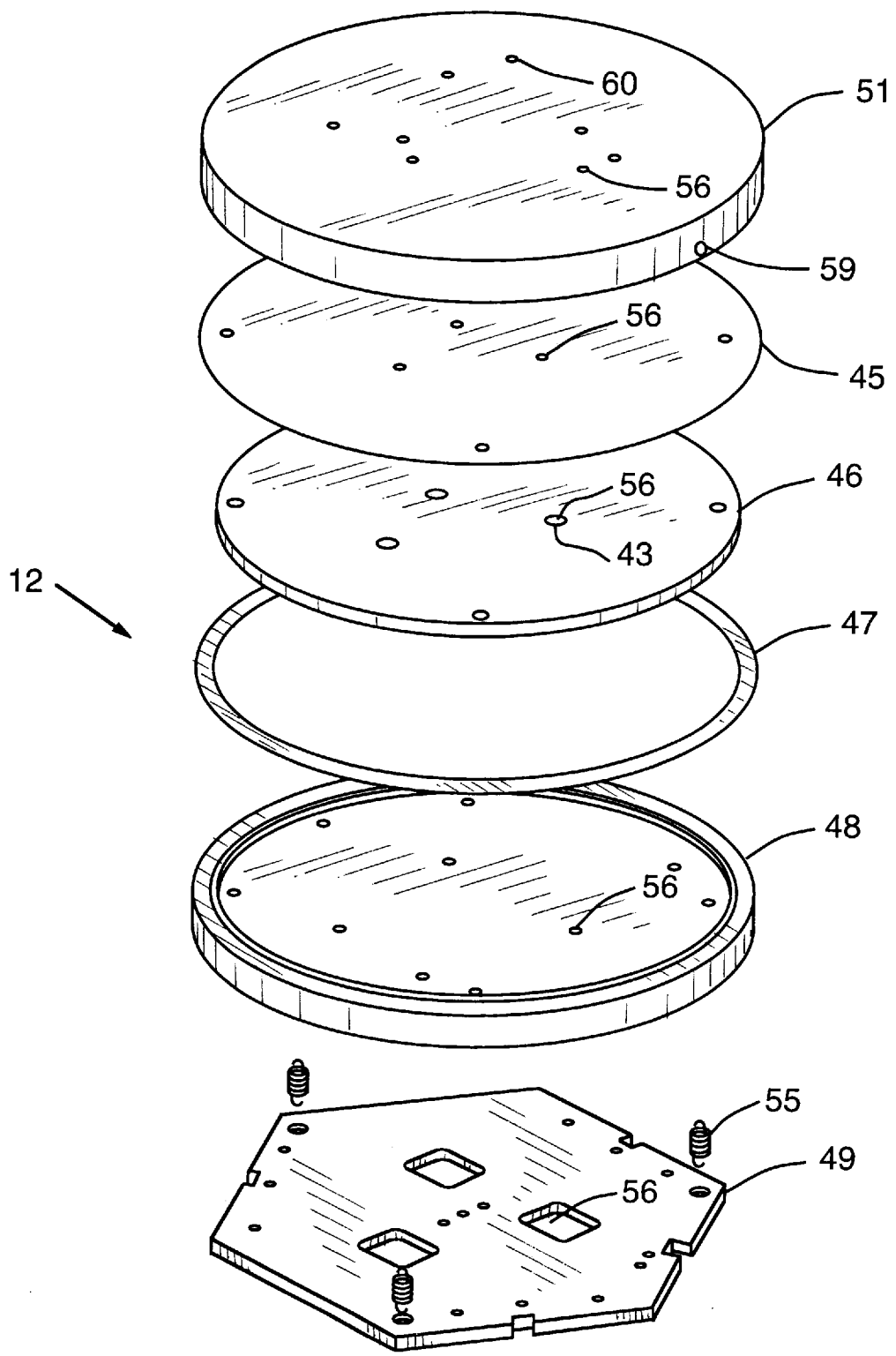

In a preferred embodiment, the thermal conditioning plate 12 is cylindrically shaped having a central axis A—A, a top surface 50, a bottom surface 52, a side 54 and at least three lift pin holes 56 extending through the top and bottom surfaces, 50 and 52, respectively. The plate 12 is preferably includes a chuck 51 and a base plate 48 formed of aluminum or other material having similar thermal conductivity and mechanical resilience. A vacuum port 58 is provided through the side 54 of the chuck 51 and runs internal to the chuck 51 to each of three support pin bores 59. In a preferred embodiment of the apparatus 10 for heating the wafers, as shown in FIG. 9, the thermal conditioning plate 12 includes a heating or cooling pad 45, such as a Kapton Heater Pad, Model # 68-6613-2 available from Gordo Sales Inc. (Layton, Utah), is placed in contact with the chuck 51 opposite the top surface 50. An insulation pad 46 is placed between the heating pad 45 and the base plate 48 and a silicon O-ring 47 is used to seal the perimeter of the insulation pad 46 between the base plate 48 and the chuck 51. Tubular bushings 43 are provided in the insulation pad 46 to prevent insulation material from plugging the lift pin holes 56 and to prevent the free release of particulate insulation material into the apparatus 10. In a preferred embodiment for the cooling apparatus 10, the thermal conditioning plate 12 is a thermoelectric cooling unit having an integrated temperature controller 14, such as a Noah Precision Model 2016, Noah Precision Inc. (San Jose, Calif.). The base plate 48 is attached to a lift plate 49 containing holes aligned with the lift pin holes 56 is attached to the bottom surface 52 of the base plate 48 and is connected to three T-shaped brackets 61 attached to linear bearings 53 that are positioned symmetrically around the perimeter of the lift plate 49. Springs 55 are provided between the lift plate 49 and the plate 12 to distribute any uneven force applied to the plate 12. The linear bearings 53 are slidably disposed within lift blocks 57 that are mounted to the base 20 in the first section 28.

Three cylindrical tubular support pins, or members, 60 having proximal ends 62 and distal ends 64 are symmetrically disposed around the axis A—A in the top surface 50 in support pin bores 59. The support pins 60 have bores therethrough which provide fluid communication between the proximal ends 62 of the support pins 60 and the vacuum port 58, thereby allowing a vacuum to be drawn through the support pins 60. Tubular shaped support pins 60 are preferred, because the tubular shape can be easily machined to the required dimensions and positioned in the top surface 50 using bores 59 that are sized to provide a slip fit of the support pins 60. It is also preferred that the support pins be constructed from a ceramic material, such as aluminum oxide, or a crystalline plastic, such as polyphenylene sulfide (PPS) or Teflon®, because it can be readily machined to the appropriate dimensions and possesses low coefficients of thermal expansion and thermal conductivity, which lessens any nonuniformities in the temperature distribution created by the presence of the support pins 60 in contact with the wafer 19. While in the preferred embodiment, three tubular ceramic support pins 60 are provided and the vacuum port 58 is connected to all three ports, it will be appreciated that any number of support pins 60 greater than three can be used and it is not necessary that the vacuum port 58 be connected to all of the support pins 60, but only to a sufficient number so that the wafer 19 is held securely on the support pins 60 and enough air is evacuated from beneath the wafer 19 as it is lowered onto the pins 60. In addition, the support pins 60 that are not used to draw a vacuum do not have to be tubular in shape; however, the tubular shape is preferred because it provides the smallest contact perimeter for a given coverage area which is beneficial from the standpoint of lessening nonuniformities in the temperature distribution across the wafer 19. The vacuum port 58 is connected to a vacuum pump (not shown) through vacuum line input 66, and the vacuum pump is maintained external to housing 18. In a preferred embodiment, a vacuum sensor can be incorporated and attached to the computer controller 16 to determine the presence of a wafer 19 on the support pins 60.

Also in a preferred embodiment, three elongated cylindrical lift pins, or elements, 70 having a longitudinal axis are slidably disposed through the corresponding lift pin holes 56 in the plate 12. The lift pins 70 each have a contacting end 72 upon which the wafer 19 is placed onto the apparatus 10 and removed therefrom. The lift pins 70 are preferably constructed using a ceramic material, such as aluminum oxide, so that the lift pins 70 can be manufactured to include a longitudinal bore extending to the contacting end 72 in which a wafer sensor 74 is disposed to detect the presence of the wafer 19 on the contacting end 72. In a preferred embodiment, the wafer sensor 74 is infrared and is disposed within the longitudinal bore of one of the lift pins 70. The lift pin bore is preferably counter sunk or dish machined out at the contacting end 72 to allow the sensor beam to fan out and the sensor 74 to be placed farther away from the contacting end 72 so as to minimize damage to the sensor 74 and the wafer 19. Additional sensors may be used in other lift pins to provide redundant sensing or to obtain information regarding the positioning of the wafer 19 on the contacting ends 72. Different types of sensors, such as vacuum or mechanical sensors, can also be employed within the scope of the invention. The lift pins 70 are positioned relative to the top surface 50, so as to provide access to bottom of the wafer 19 by automated handling equipment. In a current preferred embodiment, the plate 12 is moved to lift the wafer 19 off the pins 70. The pins 70 are mounted to the base 20 in the first section 28 using L-shaped support legs 76 and are adjustable to allow the wafer 19 to be leveled with respect to the top surface 50. Alternatively, the lift pins can be movable in lieu of the plate 12, so as to lower the wafer 19 onto the support pins 60. Also, if the lift pins 70 are constructed with a central bore, a vacuum can be applied directly to the lift pins 70. If the lift pins 70 and the plate 12 were designed so that the contacting end 72 always extended beyond the top surface 50, the lift pins 70 would produce the effect brought about using the support pins 60. In this manner, and the support pins 60 could be eliminated from the design.

In a preferred embodiment for heating assemblies, the first cover 32 contains an exhaust port 80 between an interior surface 82 and an exterior surface 84 for exhausting the solvent vapors evolved during the thermal conditioning of the wafer 19. Exhaust piping 86 is attached to the exhaust port 80 using a cap 87 and the piping 86 is connected to an exhaust manifold 88 which is directed to a facility exhaust system (not shown).

An endless rim 90 having a first edge 92 is attached to the interior surface 82 of the first cover 32. The rim 90 has dimensions greater than the wafer 19, but smaller that the thermal conditioning plate 12 and a second edge 94 designed to prevent any substantial air flow from occurring between the plate 12 and the rim 90, when the thermal conditioning plate 12 is raised such that the top surface 50 contacts the second edge 94. It is preferred that the rim 90 be constructed from a material having low thermal conductivity, but high thermal resistance, such as Teflon®, and that the second edge 94 of the rim make knife edge contact with the top surface 50 to minimize the heat loss through conduction to the rim 90 from the plate 12. Alternatively, the rim can be constructed from any thermally resistant material, and the second edge 94 can be sufficiently coated with a low thermal conductivity material to prevent a significant amount heat transfer from occurring. A small amount of heat transfer from the area of contact with the rim 90 should not greatly affect the temperature profile in the proximity of the wafer 19 because of the separation of the rim 90 from the portion of the plate 12 conditioning the wafer 19 and the proximity heating method that is being employed in a preferred embodiment. The rim 90 contains flow holes 96 which provide fluid communication between an interior region 97 and an exterior region 98 as defined by the endless rim 90. In a preferred embodiment, the rim 90 consists of two portions, a solid portion 93 and an insert portion 95 containing the flow holes 96.

A stagnation plate 100 containing perforations 162 is attached to the rim 90 between the flow holes 96 and the second edge 94, so as to define a stagnant region 104 between the stagnation plate 100 and the wafer 19, when the second edge 94 of the rim 90 is in contact with the plate 12. The perforations 102 provide a resistive flow path between the stagnant region 104 and the interior region 97. In a preferred embodiment, the perforations 102 in the stagnation plate 100 are located toward the periphery of the stagnation plate 100 so as to not be directly above the wafer 19, thereby preventing any contamination that may be carried with the air into the interior region 96 from settling out of the air stream and falling through the stagnation plate 100 on to photoresist layer of the wafer 19. In another preferred embodiment, the perforations 102 are uniformly distributed over the stagnation plate 100 in order to provide a more uniform exit flow path from the stagnant region 104 to the interior region. The skilled practitioner will appreciate that the flow patterns within the stagnant region 104 can be adapted to meet a specific requirements by varying the size and distribution of the perforations 102, as well as, the flow path through the interior region 96.

A plate sensor block 110 is mounted to the base 20 at position 111 in the first section 28 proximate to the plate 12. The sensor block 110 includes a first plate sensor 112 and a second plate sensor 114. The first plate sensor 112 is aligned to determine the presence of the plate 12 in a first, or raised, position, in which the plate 12 is contacting the second edge 94 and is in position for thermal treatment, while the second plate sensor 114 is aligned to detect the presence of the plate 12 in the second, or lowered, position below the contacting ends 72 of the lift pins 70 which is the position for loading and unloading, the wafer 19 from the apparatus 10. The first and second plate sensors, 112 and 114, respectively, are used in conjunction with wafer sensor 74 to indicate and/or verify the current step in the processing operation by transmitting signals to the computer controller 16.

In a preferred embodiment, movement of the plate 12 is provided by means of a motorized cam arrangement. A cam 120 is attached to base 20 and coupled to the lift plate 49 to translate the rotational motion of the cam 120 to linear motion of the plate 12. The cam 120 is connected to an electric motor 122 by a cam shaft 124. The motor 122 is mounted to the base 20 in the second section 30 of the housing 18 and the cam shaft 124 passes through the dividing wall 40. Commercially available motors can be used in the present invention such as a Pittman Model #GM8712E762-R2 manufactured by MSI Technologies Inc. (Englewood, Calif.). The motor 122 is controlled using a motor control board 126, such as boards manufactured by Octagon Systems Corp. (Westminster, Colo.), which is connected to the computer controller 16.

Also in a preferred embodiment for a heating assembly, the temperature controller 14 is mounted in the second section 30 of the housing 18 and is connected to and receives input instructions from the computer controller 16. The temperature controller 14 includes a temperature control panel 130 that extends through the back 26 of the housing 18 to provide access to the user. The temperature of the plate 12 is monitored using a temperature probe 132, such as a dual "sheath 6" bent remote temperature detector manufactured by Omega Engineering Inc. (Stamford, Conn.), which is disposed within the plate 12 and connected to the temperature controller 14. The temperature controller 14 can be selected from commercially available controllers, for example a Watlow 988A-20KC-ARGG controller from Instrumentors Supply, Inc. (Portland, Oreg.) is currently preferred for the heating apparatus 10. In the cooling apparatus 10, the temperature controller 14 portion of the Noah Precision Model 2016 is positioned external to the apparatus 10 and connected through the back 26 of the housing 18 to the thermal conditioning plate 12.

The computer controller 16 is preferably a single board personal computer capable of receiving input instructions and controlling the temperature controller 14 and metor control board 126, such as a Micro 5083, Model 3334 manufactured by Octagon. The computer controller 16 is mounted to the base 20 in the second section 30 adjacent to the access plate 44 to allow the computer controller 16 to be removed without disassembly of the apparatus 10. The computer controller 16 includes an input/output port 140 for connection to a main system computer (not shown).

A electrical jack 142 is attached to the back 26 to provide an electrical connection for the temperature controller 14, the computer controller 16 and the motor 120 to an external alternating current 110 volt power source.

In the operation of the present invention, the thermal conditioning plate 12 is seated in a lowered position. The wafer sensor 74 does not detect the presence of a wafer 19 and the second plate sensor 114 detects the presence of the plate 12 in its lower position, the computer controller 16 interprets the signals to mean that the apparatus 10 is ready to receive the wafer 19. The wafer 19 is introduced into the apparatus 10 through the opening 38 and is placed upon the contacting end 72 on the lift pins 70 using a conventional wafer handling apparatus. The wafer sensor 74 in the lift pin 70 detects the presence of the wafer 19 and sends a signal indicating this condition to the computer controller 16 and second plate sensor 114 provides a signal to the computer controller 16 indicating that the plate 12 is in the lower position. The computer controller 16 in response to the signals activates the vacuum pump to begin drawing air through the support pins 60 producing a negative pressure drop in the region below the wafer 19 relative to the region above the wafer 19 that holds the wafer 19 on the lift pins 70. Contemporaneously with the activation of the vacuum pump, the motor 122 is activated to turn the cam 120 raising the plate 12 toward the first, or raised, position. When the proximal ends 62 of the support pins 60 contact the back side of the wafer 19, the wafer 19 is lifted off the contacting end 72 of the lift pins 70 and is supported by the support pins 60. When the plate 12 reaches the raised position, the top surface 50 contacts the second edge 94 of the rim 90 and the force exerted on the top surface 50 by the second edge 94 will be translated through the lift plate 49 causing the springs 55 to compress and thereby exerting a counter force ensuring good contact between the top surface 50 and the second edge 94. The vacuum being drawn through the support pins 60 secures the wafer 19 on the pins 60. In an alternative embodiment, the change in pressure resulting from the presence of the wafer 19 on the pins 60 can be detected using a vacuum sensor that can be coupled to the computer controller 16 to control the thermal conditioning in response to the signal. During this period of time, the exhaust fan is run to create a pressure drop from the stagnant region 104 to the interior region 96. The heating of the wafer 19 causes the solvents present in the photoresist coating to vaporize and enter the stagnant region 104. The pressure drop across the perforations 102 in the 100 from the stagnant region 104 to the interior region 96 causes the solvent vapors to flow through the perforations 102 in the stagnation plate 100 and the resistance of the stagnation plate 100 minimizes direct contact between cool air entering the interior region 96 from the exterior region 98. At the end of the heating period, the computer controller 16 turns off the heating element and activates the motor 120 to lower the plate 12 to the lower position and the wafer 19 is transferred back to the lift pins 70, at which time the wafer 19 can be removed from the apparatus 10 using a conventional wafer handling apparatus.

Those of ordinary skill in the art will appreciate that the present invention provides significant advantages over the prior art for thermal conditioning plate-like material. In particular, the subject invention provides a more precise apparatus and method for handling plate-like material that are to be thermally conditioned. In addition, the invention provides increased uniformity in the heating, cooling and exhausting of the plate-like material during treatment operation. While the subject invention provides these and other advantages over other the prior art, it will be understood, however, that various changes in the details, materials and arrangements of parts and steps which have been herein described and illustrated in order to explain the nature of the invention may be made by those skilled in the art within the principle and scope of the invention as expressed in the appended claims.

What is claimed is:

1. A thermal conditioning apparatus comprising:
    an enclosure having an opening for inserting a wafer to be thermally conditioned, said enclosure having supporting elements for a plate having a top surface, said plate having a thermal conditioning element;
    a temperature controller coupled to said thermal conditioning element to control the temperature of the top surface of said plate;
    a computer controller coupled to said temperature controller for controlling said temperature controller;
    at least three support members each having a proximal end and a longitudinal axis and at least one of said support members containing a bore extending from said proximal end along said longitudinal axis of said at least one support members, said support members being mounted in said top surface with each said proximal end thereof extending beyond said top surface;
    a negative pressure source connected by a port in said plate with said at least one bore;
    at least three lift elements having contacting ends disposed through and movable relative to said top surface of said plate;
    a drive for moving said top surface relative to said lift elements; and,
    a sensor positioned to detect the presence of material on at least one of said contacting ends of said lift elements.

2. The apparatus of claim 1 wherein said support members comprise a ceramic material.

3. The apparatus of claim 1 wherein said drive is a plate drive assembly, comprising:
    a cam coupled to said plate, said cam having a first rotational position corresponding to said plate being in a first position wherein said lift elements are in a retracted position with respect to said top surface of said plate and a second rotational position corresponding to said plate being in a second position wherein said lift elements extend through said top surface of said plate;
    a cam shaft having a cam end and a motor end, and said cam end being attached to said cam;
    a motor attached to said motor end of said cam to turn said cam between the first and second rotational positions; and,
    a motor controller controllably connected between said motor and said computer controller.

4. The apparatus of claim 1, wherein said support members comprise cylindrically shaped tubes.

5. The apparatus of claim 1, wherein said support members are symmetrically disposed in said top surface.

6. The apparatus of claim 1, wherein said support members are axisymmetrically disposed in said top surface.

7. The apparatus of claim 1, wherein said support members are axisymmetrically disposed in said top surface about a central axis passing perpendicularly through said top surface.

8. The apparatus of claim 1, wherein said support members each contain a bore extending from said proximal end along said longitudinal axis of said at least one support member.

9. The apparatus of claim 1, wherein said support members extend from said top surface an equal distance.

10. The apparatus of claim 1, wherein said support members are constructed from a material selected from the group consisting of a ceramic material a crystalline plastic, and Teflon®.

11. The apparatus of claim 1, wherein said top surface is circular.

12. The apparatus of claim 1, wherein said temperature controller comprises a temperature controlled heater.

13. The apparatus of claim 1, wherein said lifting elements comprise lift pins.

14. The apparatus of claim 1, wherein said computer controller is coupled to said sensor for controlling said negative pressure source in response to said signal received from said sensor.

15. The apparatus of claim 1, wherein said negative pressure source includes a vacuum sensor connected to provide a signal to said computer controller.

16. The apparatus of claim 15, wherein said computer controller activates the temperature controller to perform thermal conditioning in response to said signal from said vacuum sensor.

17. The apparatus of claim 1 wherein said negative pressure source include a vacuum source.

18. The apparatus of claim 1 wherein:
at least one of said lift elements includes a longitudinal axis and a bore extending from said contacting end along said longitudinal axis of said at least one lift element; and,
said sensor is disposed within said bore.

19. The apparatus of claim 1 wherein said sensor comprises a infrared sensor.

20. The apparatus of claim 1 wherein said negative pressure source is operatively coupled to said computer controller, said computer controller controlling said negative pressure source in response to a signal from said sensor.

21. The apparatus of claim 1, wherein said lift elements are stationary, said plate being moveable relative to said lift elements.

22. The apparatus of claim 1, wherein said computer controller controls said temperature controller, said negative pressure source, said sensor, and said relative movement of said lift elements and said plate.

23. A thermal conditioning apparatus comprising:
an enclosure having an opening for inserting a wafer to be thermally conditioned, said enclosure having supporting elements for a plate having a top surface, said plate having a thermal conditioning element;
a temperature controller coupled to said thermal conditioning element to control the temperature of the top surface of said plate;
a computer controller coupled to said temperature controller for controlling said temperature controller;
a cover adjacent said top side of said plate, having an exhaust port;
an endless rim having a first edge attached to said cover defining an interior and an exterior region, a second edge, and at least one flow passage from said interior to said exterior regions, said exhaust port being in fluid communication with said interior region and said second edge seated on said top surface of said plate when said plate is in a first position; and,
a stagnation plate attached to said rim in said interior region between said at least one flow passage and said second edge, said stagnation plate dimensioned so that passages are formed between said rim and said stagnation plate, so as to provide at least one flow path around said stagnation plate to said exhaust port.

24. The apparatus of claim 23 wherein said apparatus further comprises:
at least three lift elements having contacting ends for contacting material placed on said plate, said lift elements being slidably disposed through said plate;
a drive for moving said top surface relative to said lift elements; and
a sensor positioned to detect the presence of material on at least one of said contacting ends of said lift elements and provide a signal to said computer controller.

25. The apparatus of claim 24 wherein:
said at least one of said lift elements includes a longitudinal axis and a longitudinal bore extending from said contacting end along said longitudinal axis of said lift elements; and
said sensor is disposed within said longitudinal bore.

26. The apparatus of claim 23 further comprising:
at least three support members having a proximal end and at least one of said support members having a longitudinal axis a bore extending from said proximal end along said longitudinal axis of said at least one support member and said support members are mounted in said top surface with each said proximal end thereof extending beyond said top surface; and,
a negative pressure source connected to said bore in said at least one support member.

27. The apparatus of claim 26, further comprising:
a cam coupled to said plate having a first rotational position corresponding to said plate being in a first position wherein said lift elements are in a retracted position with respect to said top surface of said plate and a second rotational position corresponding to said plate being in a second position wherein said lift elements extend through said top surface of said plate;
a cam shaft having a cam end and a motor end, and said cam end being attached to said cam;
a motor attached to said motor end of said cam to turn said cam between the first and second rotational positions; and,
a motor controller controllably connected between said motor and said computer controller.

28. The apparatus of claim 23, further comprising an exhaust fan disposed in said exhaust port.

29. The apparatus of claim 23, wherein said at least one flow path comprises a plurality of perforations in said stagnation plate.

30. The apparatus of claim 23, wherein said at least one flow path is provided between said stagnation plate and said rim.

31. The apparatus of claim 23, wherein said at least one flow path comprises a plurality of uniformly distributed circular apertures in said stagnation plate.

32. The apparatus of claim 23, wherein said second edge is comprised of a low thermal conductivity material.

33. The apparatus of claim 23, wherein said rim comprises:
an insert portion containing said at least one flow passage; and,
a solid portion including said second edge, dimensioned to permit said insert portion to rest on top of said solid portion.

34. The apparatus of claim 23, wherein said at least one flow passage comprises a plurality of flow holes distributed around said rim, said holes formed in said first edge.

35. A thermal conditioning apparatus comprising:
an enclosure having an opening for inserting a wafer to be thermally conditioned, said enclosure having supporting elements for a plate having a top surface, said plate having a thermal conditioning element;
a temperature controller coupled to said thermal conditioning element to control the temperature of the top surface of said plate;

a computer controller coupled to said temperature controller for controlling said temperature controller;

at least three support members each having a proximal end and a longitudinal axis and at least one of said support members containing a bore extending from said proximal end along said longitudinal axis of said support member, said support members being mounted in said top surface with each said proximal end thereof extending beyond said top surface;

a negative pressure source connected by a port in said plate with said at least one bore;

at least three lift elements having contacting ends disposed through and movable relative to said top surface of said plate;

a plate drive assembly, comprising:
   a cam coupled to said plate, said cam having a first rotational position corresponding to said plate being in a first position and a second rotational position corresponding to said plate being in a second position;
   a cam shaft having a cam end and a motor end, and said cam end being attached to said cam;
   a motor attached to said motor end of said cam to turn said cam between the first and second rotational positions; and,
   a motor controller operatively connected to said motor and said computer controller.

36. A thermal conditioning apparatus comprising:

an enclosure having an opening for inserting a wafer to be thermally conditioned, said enclosure having supporting elements for a plate having a top surface, said plate having a thermal conditioning element;

a temperature controller coupled to said thermal conditioning element to control the temperature of the top surface of said plate;

a computer controller coupled to said temperature controller for controlling said temperature controller;

at least three support members each having a proximal end and a longitudinal axis and at least one of said support members containing a bore extending from said proximal end along said longitudinal axis of said support member, said support members being mounted in said top surface with each said proximal end thereof extending beyond said top surface; and, a negative pressure source connected by a port in said plate with said at least one bore, wherein said negative pressure source includes a vacuum sensor connected to provide a signal to said computer controller.

37. A thermal conditioning apparatus comprising:

an enclosure having an opening for inserting a wafer to be thermally conditioned and a cover resting on top of said enclosure, said enclosure having supporting elements for a plate having a top surface, said plate having a thermal conditioning element;

a temperature controller coupled to said thermal conditioning element to control the temperature of the top surface of said plate;

a computer controller coupled to said temperature controller for controlling said temperature controller;

at least three support members each having a proximal end and a longitudinal axis and at least one of said support members containing a bore extending from said proximal end along said longitudinal axis of said support member, said support members being mounted in said top surface with each said proximal end thereof extending beyond said top surface;

a negative pressure source connected by a port in said plate with said at least one bore;

at least three lift elements having contacting ends disposed through and movable relative to said top surface of said plate;

a sensor positioned to detect the presence of material on at least one of said contacting ends of said lift elements;

said cover adjacent said top side of said plate, having an exhaust port;

an endless rim having a first edge attached to said cover defining an interior and an exterior region, a second edge, and at least one flow passage from said interior to said exterior regions, said exhaust port being in fluid communication with said interior region and said second edge seated on said top surface of said plate when said plate is in a first position; and, a stagnation plate attached to said rim in said interior region between said at least one flow passage and said second edge, said stagnation plate dimensioned so that passages are formed between said rim and said stagnation plate, so as to provide at least one flow path around said stagnation plate to said exhaust port.

38. A thermal conditioning apparatus comprising:

an enclosure having an opening for inserting a wafer to be thermally conditioned, said enclosure having supporting elements for a plate having a top surface, said plate having a thermal conditioning element;

a temperature controller coupled to said thermal conditioning element to control the temperature of the top surface of said plate;

a computer controller coupled to said temperature controller for controlling said temperature controller;

at least three support members each having a proximal end and a longitudinal axis and at least one of said support members containing a bore extending from said proximal end along said longitudinal axis of said support member, said support members being mounted in said top surface with each said proximal end thereof extending beyond said top surface;

a negative pressure source connected by a port in said plate with said at least one bore;

at least three lift elements having contacting ends disposed through and movable relative to said top surface of said plate;

a sensor positioned to detect the presence of material on at least one of said contacting ends of said lift elements;

a plate drive assembly, comprising:
   a cam coupled to said plate, said cam having a first rotational position corresponding to said plate being in a first position and a second rotational position corresponding to said plate being in a second position;
   a cam shaft having a cam end and a motor end, and said cam end being attached to said cam;
   a motor attached to said motor end of said cam to turn said cam between the first and second rotational positions; and,
   a motor controller operatively connected to said motor and said computer controller, wherein said computer controller couples said temperature controller, said negative pressure source, said sensor, and said plate drive assembly.

* * * * *

UNITED STATES PATENT AND TRADEMARK OFFICE
CERTIFICATE OF CORRECTION

PATENT NO. : 5,885,353
DATED : March 23, 1999
INVENTOR(S) : Strodtbeck et al.

It is certified that error appears in the above-identified patent and that said Letters Patent is hereby corrected as shown below:

Column 2,
Line 34, delete "shutdown" and substitute therefor -- shut down --.

Column 3,
Line 19, delete the first occurrence of "the".
Line 32, insert -- to -- after "attached".
Line 34, delete "of".
Line 64, delete "a" and substitute therefor -- an --.

Column 4,
Line 60, delete "a" and substitute therefor -- an --.

Column 5,
Line 25, delete the first occurrence of "by" and substitute therefor -- or --.
Line 33, delete "is".

Column 6,
Line 61, insert -- the -- before "bottom".

Column 7,
Line 7, after "about" insert -- by --.
Line 8, delete "and".
Line 20, delete "that" and substitute therefor -- than --.
Line 33, after "amount" insert -- of --.
Line 59, before "photoresist" insert -- the --.
Line 65, delete "a".

Column 8,
Line 61, delete "A" and substitute therefor -- An --.

Column 9,
Line 41, before "100" insert -- stagnation plate --.
Line 57, delete "are" and substitute therefor -- is --.
Line 61, delete "other".

UNITED STATES PATENT AND TRADEMARK OFFICE
CERTIFICATE OF CORRECTION

PATENT NO.   : 5,885,353
DATED        : March 23, 1999
INVENTOR(S)  : Strodtbeck et al.

Page 2 of 3

Figure 6:
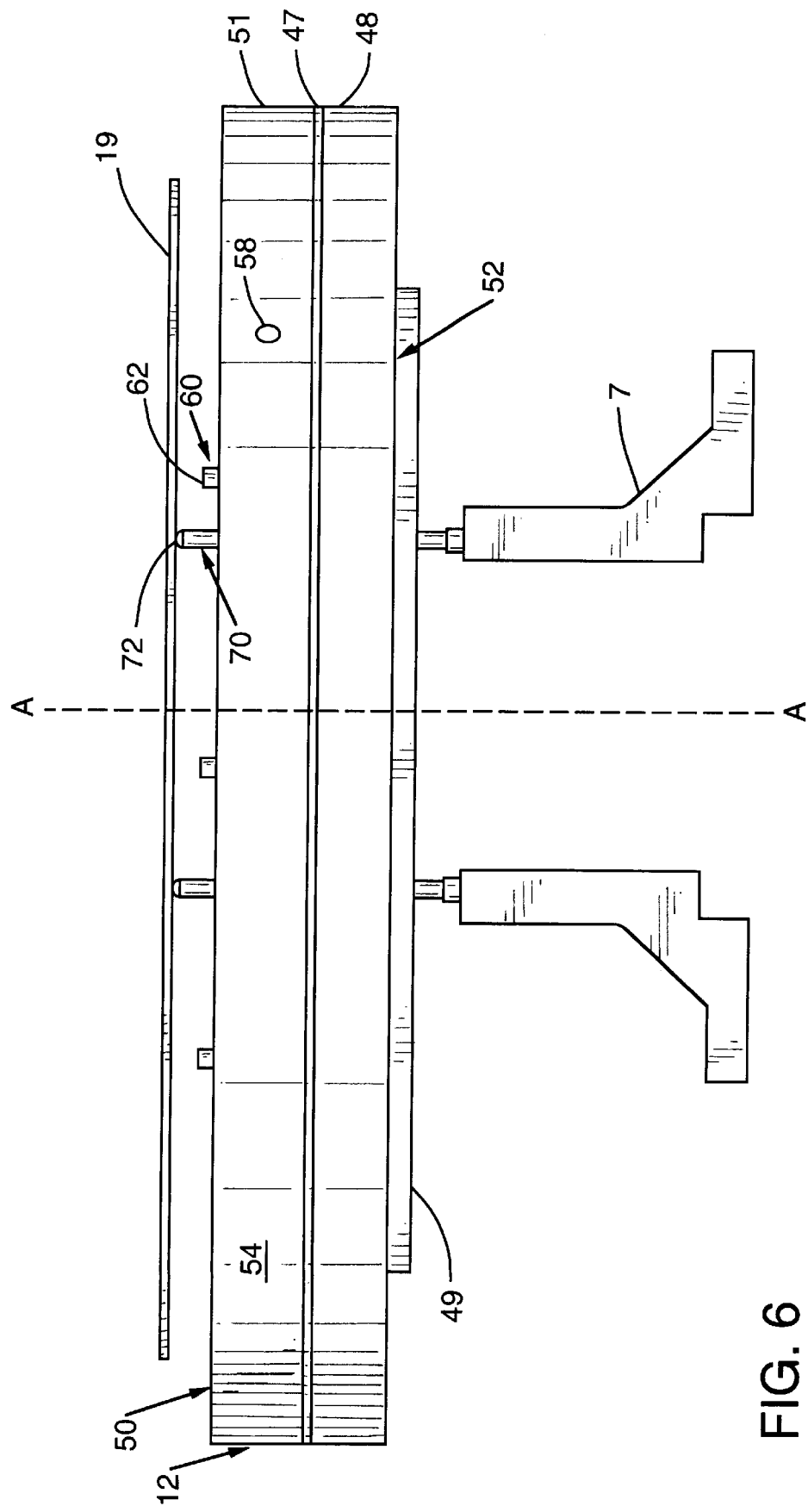
FIG. 6 is a side view of the thermal conditioning plate and lift pins of the present invention holding a wafer.

It is certified that error appears in the above-identified patent and that said Letters Patent is hereby corrected as shown below:

Drawings,
Figure 6, delete reference numeral "7" and substitute therefor -- 76 --.

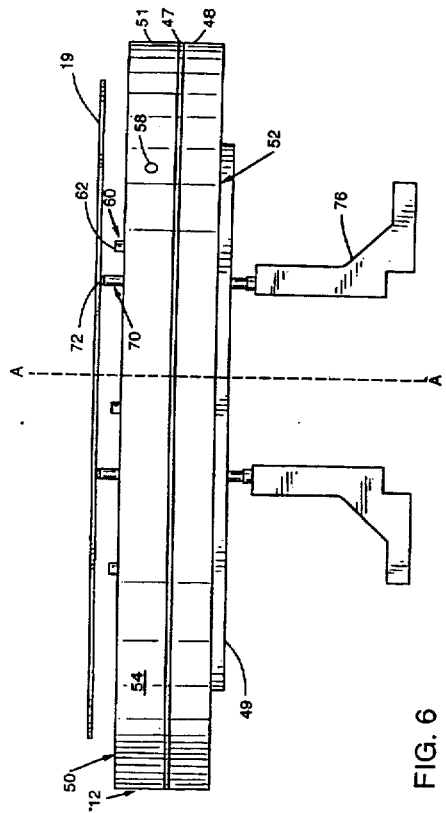

FIG. 6

UNITED STATES PATENT AND TRADEMARK OFFICE
CERTIFICATE OF CORRECTION

PATENT NO. : 5,885,353  
DATED : March 23, 1999  
INVENTOR(S) : Strodtbeck et al.

Page 3 of 3

Figure 7:
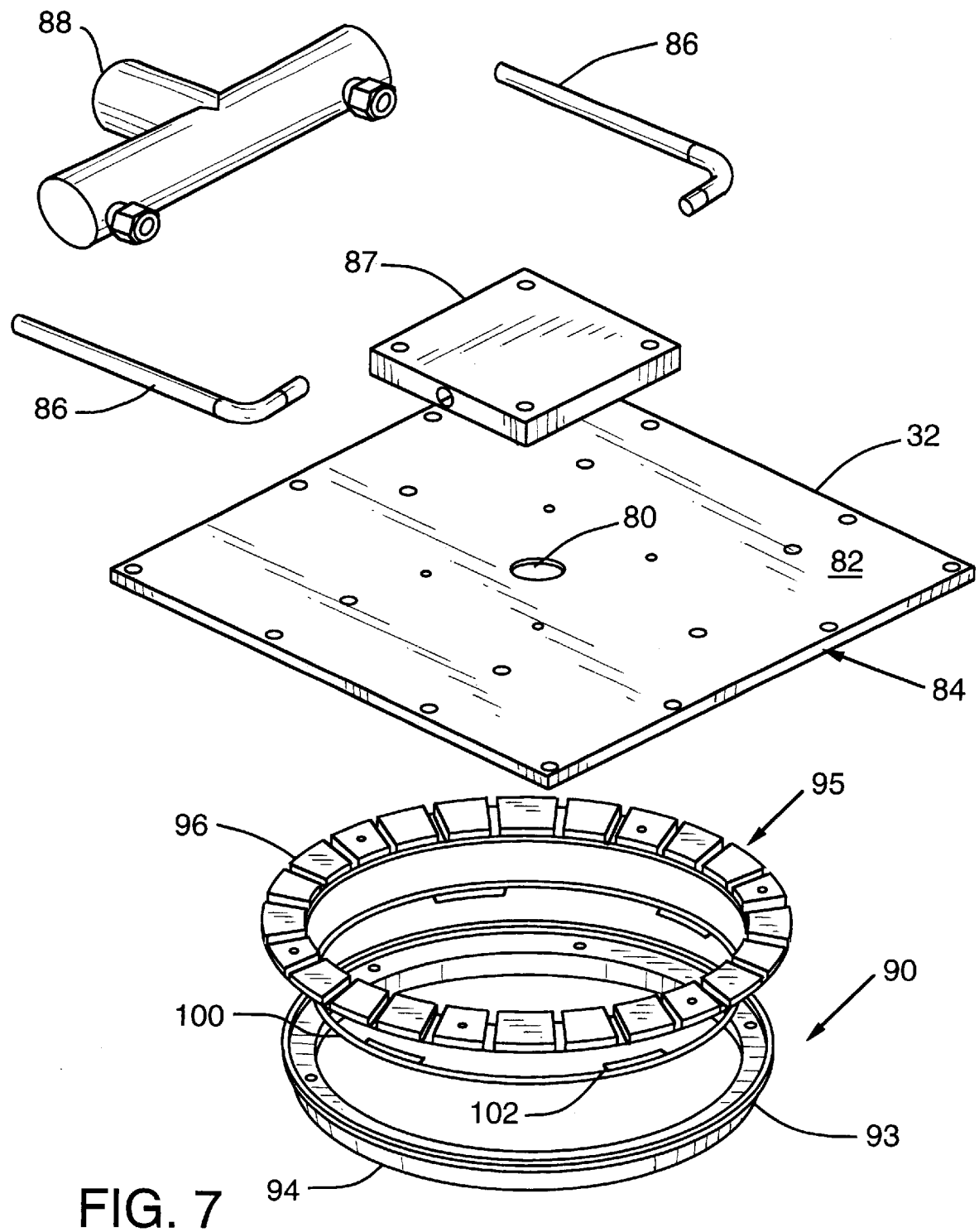
FIG. 7 is a exploded perspective view of an exhaust system embodiment of the present invention.
Figure 8:
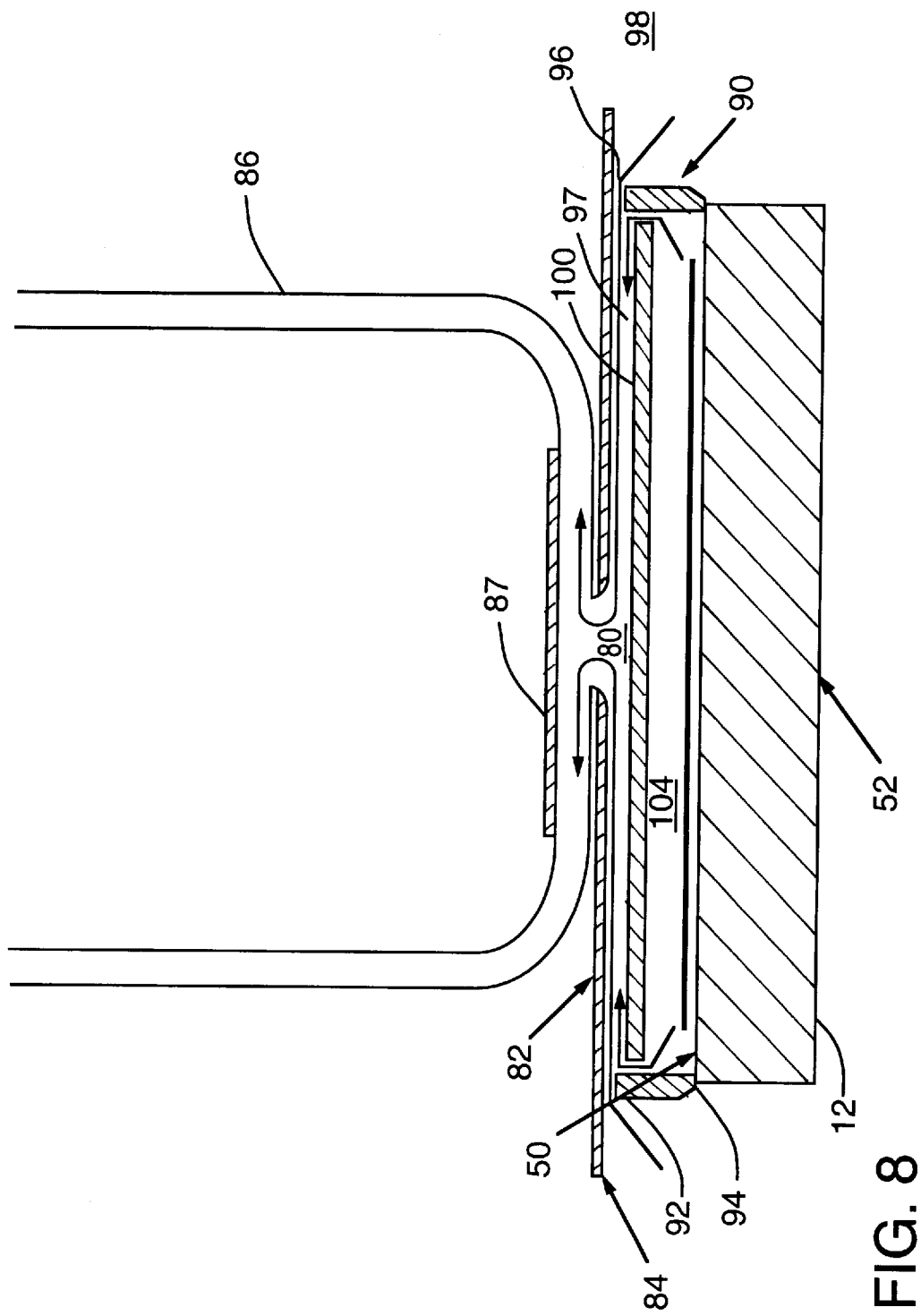
FIG. 8 is a side view of an exhaust system embodiment of the present invention; and, FIG. 9 is an exploded perspective view of the thermal conditioning plate of the present invention.

It is certified that error appears in the above-identified patent and that said Letters Patent is hereby corrected as shown below:

Figure 7, the reference numeral 96 should be applied to the flow hole.

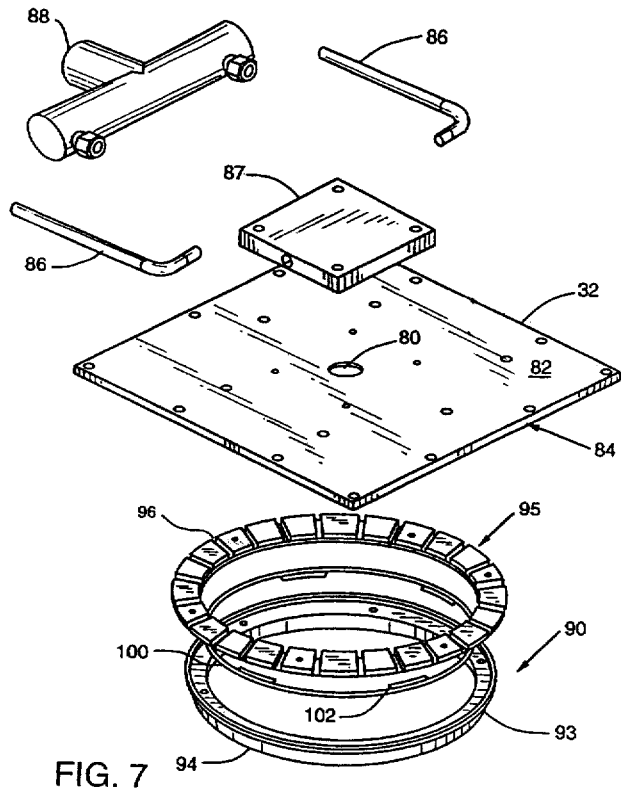

FIG. 7

Signed and Sealed this

Twenty-second Day of January, 2002

*Attest:*

*Attesting Officer*

JAMES E. ROGAN  
*Director of the United States Patent and Trademark Office*